US012272109B2

(12) United States Patent
Vianello et al.

(10) Patent No.: US 12,272,109 B2
(45) Date of Patent: *Apr. 8, 2025

(54) METHOD AND SYSTEM FOR AUTOMATED DEBRIS DETECTION (71) Applicant: Cape Analytics, Inc., Mountain View, CA (US)

(72) Inventors: Giacomo Vianello, Mountain View, CA (US); Robert Davis, Mountain View, CA (US); John K. Clark, Mountain View, CA (US); Jonathan M. Fisher, Mountain View, CA (US)

(73) Assignee: Cape Analytics, Inc., Palo Alto, CA (US)

( * ) Notice: Subject to any disclaimer, the term of this patent is extended or adjusted under 35 U.S.C. 154(b) by 312 days.

This patent is subject to a terminal disclaimer.

(21) Appl. No.: 17/749,385

(22) Filed: May 20, 2022

(65) Prior Publication Data

US 2022/0277538 A1  Sep. 1, 2022

Related U.S. Application Data (63) Continuation of application No. 17/502,825, filed on Oct. 15, 2021, now Pat. No. 11,367,265.

(Continued)

(51) Int. Cl.
*G06K 9/00* (2022.01)
*G06F 18/24* (2023.01)
(Continued)

(52) U.S. Cl.
CPC .............. *G06V 10/22* (2022.01); *G06F 18/24* (2023.01); *G06F 30/13* (2020.01); *G06T 7/50* (2017.01);
(Continued)

(58) Field of Classification Search
CPC ...... G06V 10/22; G06V 10/25; G06V 10/273; G06V 20/176; G06V 20/188; G06F 30/13;
(Continued)

(56) References Cited

U.S. PATENT DOCUMENTS

| 5,633,946 A | 5/1997 | Lachinski et al. |
| 6,044,171 A | 3/2000 | Polyakov et al. |

(Continued)

FOREIGN PATENT DOCUMENTS

| CN | 101549596 B | 8/2012 |
| CN | 103679726 A * | 3/2014 |

(Continued)

OTHER PUBLICATIONS

Classifying Urban Landscape in Aerial LIDAR Using 3D Shape Analysis, Matthew Carlberg et al., IEEE, 2009, pp. 1701-1704 (Year: 2009).*

(Continued)

*Primary Examiner* — Jayesh A Patel
(74) *Attorney, Agent, or Firm* — Jeffrey Schox; Diana Lin (57) ABSTRACT

In variants, the method for automatic debris detection includes: determining a region image; optionally determining a parcel representation for the region image; generating a debris representation using the region image; generating a debris score based on the debris representation; and optionally monitoring the debris score over time.

19 Claims, 7 Drawing Sheets

Related U.S. Application Data (60) Provisional application No. 63/092,283, filed on Oct. 15, 2020.

(51) Int. Cl.
*G06F 30/13* (2020.01)
*G06T 7/50* (2017.01)
*G06V 10/22* (2022.01)
*G06V 10/25* (2022.01)
*G06V 10/26* (2022.01)
*G06V 20/10* (2022.01)
*G06N 20/00* (2019.01)

(52) U.S. Cl.
CPC ............ *G06V 10/25* (2022.01); *G06V 10/273* (2022.01); *G06V 20/176* (2022.01); *G06V 20/188* (2022.01); *G06N 20/00* (2019.01)

(58) Field of Classification Search
CPC ...... G06K 9/6232; G06K 9/6267; G06T 7/50; G06N 20/00
See application file for complete search history.

(56) References Cited

U.S. PATENT DOCUMENTS

| | | | |
|---|---|---|---|
| 6,249,616 B1 | 6/2001 | Hashimoto | |
| 7,327,902 B2 | 2/2008 | Ritt et al. | |
| 7,873,238 B2 | 1/2011 | Schultz et al. | |
| 7,945,117 B2 | 5/2011 | Hermosillo et al. | |
| 8,078,436 B2 | 12/2011 | Pershing et al. | |
| 8,081,841 B2 | 12/2011 | Schultz et al. | |
| 8,145,578 B2 | 3/2012 | Pershing et al. | |
| 8,170,840 B2 | 5/2012 | Pershing | |
| 8,207,964 B1 | 6/2012 | Meadow et al. | |
| 8,209,152 B2 | 6/2012 | Pershing | |
| 8,401,222 B2 | 3/2013 | Thornberry et al. | |
| 8,452,125 B2 | 5/2013 | Schultz et al. | |
| 8,515,125 B2 | 8/2013 | Thornberry et al. | |
| 8,531,472 B2 | 9/2013 | Freund et al. | |
| 8,542,880 B2 | 9/2013 | Thornberry et al. | |
| 8,655,070 B1 | 2/2014 | Yang et al. | |
| 8,660,382 B2 | 2/2014 | Schultz et al. | |
| 8,670,961 B2 | 3/2014 | Pershing et al. | |
| 8,731,234 B1 | 5/2014 | Ciarcia et al. | |
| 8,774,525 B2 | 7/2014 | Pershing | |
| 8,818,770 B2 | 8/2014 | Pershing | |
| 8,823,732 B2 | 9/2014 | Adams et al. | |
| 8,825,454 B2 | 9/2014 | Pershing | |
| 8,977,520 B2 | 3/2015 | Stephens et al. | |
| 8,995,757 B1 | 3/2015 | Ciarcia et al. | |
| 9,117,310 B2 | 8/2015 | Coene et al. | |
| 9,129,376 B2 | 9/2015 | Pershing | |
| 9,135,737 B2 | 9/2015 | Pershing | |
| 9,141,880 B2 | 9/2015 | Ciarcia | |
| 9,147,287 B2 | 9/2015 | Ciarcia | |
| 9,159,130 B2 | 10/2015 | Kneepkens | |
| 9,159,164 B2 | 10/2015 | Ciarcia | |
| 9,183,538 B2 | 11/2015 | Thornberry et al. | |
| 9,244,589 B2 | 1/2016 | Thornberry et al. | |
| 9,275,496 B2 | 3/2016 | Freund et al. | |
| 9,292,913 B2 | 3/2016 | Schultz et al. | |
| 9,329,749 B2 | 5/2016 | Thornberry et al. | |
| 9,437,029 B2 | 9/2016 | Schultz et al. | |
| 9,514,568 B2 | 12/2016 | Pershing et al. | |
| 9,520,000 B2 | 12/2016 | Freund et al. | |
| 9,542,738 B2 | 1/2017 | Schultz et al. | |
| 9,576,201 B2 | 2/2017 | Wu et al. | |
| 9,599,466 B2 | 3/2017 | Pershing | |
| 9,743,046 B2 | 8/2017 | Giuffrida et al. | |
| 9,753,950 B2 | 9/2017 | Schultz et al. | |
| 9,805,489 B2 | 10/2017 | Schultz et al. | |
| 9,836,882 B2 | 12/2017 | Freund et al. | |
| 9,911,228 B2 | 3/2018 | Pershing et al. | |
| 9,933,254 B2 | 4/2018 | Thornberry et al. | |
| 9,933,257 B2 | 4/2018 | Pershing | |
| 9,959,581 B2 | 5/2018 | Pershing | |
| 9,959,653 B2 | 5/2018 | Schultz et al. | |
| 9,972,126 B2 | 5/2018 | Freund et al. | |
| 10,169,680 B1 | 1/2019 | Sachdeva et al. | |
| 10,197,391 B2 | 2/2019 | Thornberry et al. | |
| 10,229,532 B2 | 3/2019 | Freund et al. | |
| 10,311,302 B2 * | 6/2019 | Kottenstette ........ G06F 18/2413 | |
| 10,338,222 B2 | 7/2019 | Schultz et al. | |
| 10,346,935 B2 | 7/2019 | Thornberry et al. | |
| 10,402,676 B2 | 9/2019 | Wang et al. | |
| 10,455,197 B2 | 10/2019 | Giuffrida et al. | |
| 10,489,953 B2 | 11/2019 | Schultz et al. | |
| 10,503,843 B2 | 12/2019 | Keane | |
| 10,515,414 B2 | 12/2019 | Pershing | |
| 10,528,960 B2 | 1/2020 | Pershing et al. | |
| 10,529,029 B2 | 1/2020 | Okazaki | |
| 10,571,575 B2 | 2/2020 | Schultz et al. | |
| 10,573,069 B2 | 2/2020 | Freund et al. | |
| 10,648,800 B2 | 5/2020 | Thornberry et al. | |
| 10,650,285 B1 | 5/2020 | Okazaki | |
| 10,663,294 B2 | 5/2020 | Pershing et al. | |
| 10,685,149 B2 | 6/2020 | Pershing | |
| 10,796,189 B2 | 10/2020 | Wang et al. | |
| 10,839,469 B2 | 11/2020 | Pershing | |
| 10,937,178 B1 | 3/2021 | Srinivasan | |
| 11,367,265 B2 * | 6/2022 | Vianello ................... G06T 7/50 | |
| 2003/0146913 A1 | 8/2003 | Shen et al. | |
| 2005/0084178 A1 | 4/2005 | Lure et al. | |
| 2006/0165267 A1 | 7/2006 | Wyman et al. | |
| 2009/0132436 A1 | 5/2009 | Pershing et al. | |
| 2010/0014781 A1 | 1/2010 | Liu et al. | |
| 2010/0110074 A1 | 5/2010 | Pershing | |
| 2010/0111428 A1 | 5/2010 | Yu et al. | |
| 2010/0296693 A1 | 11/2010 | Thornberry et al. | |
| 2012/0035887 A1 | 2/2012 | Augenbraun et al. | |
| 2012/0141014 A1 | 6/2012 | Lepikhin et al. | |
| 2013/0121571 A1 | 5/2013 | Gokturk et al. | |
| 2014/0015924 A1 | 1/2014 | Pryor | |
| 2014/0019166 A1 | 1/2014 | Swanson et al. | |
| 2014/0139515 A1 | 5/2014 | Kim et al. | |
| 2014/0180989 A1 | 6/2014 | Krizhevsky et al. | |
| 2014/0270492 A1 | 9/2014 | Christopulos et al. | |
| 2014/0278570 A1 * | 9/2014 | Plummer ............. G06T 7/0004 |
| | | | 705/4 |
| 2015/0131852 A1 | 5/2015 | Sweetser et al. | |
| 2015/0186953 A1 * | 7/2015 | Gross ................... G06T 1/0007 |
| | | | 705/14.58 |
| 2015/0228031 A1 | 8/2015 | Emison et al. | |
| 2015/0269598 A1 | 9/2015 | Terrazas et al. | |
| 2015/0286786 A1 | 10/2015 | El-Baz et al. | |
| 2015/0347872 A1 | 12/2015 | Taylor et al. | |
| 2016/0026900 A1 | 1/2016 | Ando | |
| 2019/0065907 A1 * | 2/2019 | Strong ................... G06N 3/045 | |
| 2019/0138665 A1 | 5/2019 | Pershing | |
| 2019/0213412 A1 | 7/2019 | Kottenstette et al. | |
| 2019/0213438 A1 | 7/2019 | Jones et al. | |
| 2019/0304026 A1 * | 10/2019 | Lyman ................... G06Q 40/08 | |
| 2019/0354772 A1 | 11/2019 | Tasli et al. | |
| 2020/0134753 A1 | 4/2020 | Vickers | |
| 2020/0160030 A1 | 5/2020 | Lavi | |
| 2021/0042846 A1 * | 2/2021 | Plummer ................... G06T 7/00 | |
| 2021/0089811 A1 * | 3/2021 | Strong ................ G06V 20/176 | |
| 2021/0118165 A1 | 4/2021 | Strong | |
| 2021/0133891 A1 | 5/2021 | Jagannathan | |
| 2021/0188312 A1 | 6/2021 | Shikari et al. | |
| 2022/0253946 A1 | 8/2022 | Kenney | |

FOREIGN PATENT DOCUMENTS

| | | | | |
|---|---|---|---|---|
| CN | 108197583 A | | 6/2018 | |
| CN | 108629287 A * | | 10/2018 | |
| EP | 3151164 A2 * | | 4/2017 | ......... G06K 9/00771 |
| EP | 3340106 A1 * | | 6/2018 | ............. G06F 18/24 |

(56) References Cited

FOREIGN PATENT DOCUMENTS

| WO | WO-2012115594 A1 | * | 8/2012 | ......... | G06K 9/00771 |
| WO | WO-2017040691 A1 | * | 3/2017 | ......... | G06F 18/2413 |

OTHER PUBLICATIONS

Integrated Aerial-Based and Ground-Based Damage Assessment of Single Family at the Neighborhood and Per-Building Spatial Scales, Carol J Friedland et al., Feb. 2015, pp. 1-8 (Year: 2015).*
Automatic Urban Debris zone extraction from post hurricane very high-resolution satellite and aerial imagery, Sasha Jiang et al., Taylor and Francis, 2016, pp. 933-952 (Year: 2016).*
Earthquake Building Damage Detection Using VHR Satellite Data, Babak Mansouri et al., JSEE, 2019, pp. 45-56 (Year: 2019).*
Corbin, Matthew, et al., "System and Method for Property Data Management", U.S. Appl. No. 18/104,969, filed Feb. 2, 2023.
Lee, Xiang, et al., "System and Method for Property Analysis", U.S. Appl. No. 18/303,990, filed Apr. 20, 2023.
"Geospatial Property Analytics: Supercharging AVMs for SFR Investing", Cape Analytics, downloaded Oct. 3, 2022, https://capeanalytics.com/blog/geospatial-property-analytics-avm-sfr-investing/.
"ValPro+—Cape Analytics", Cape Analytics, https://web.archive.org/web/20210301122341/https://capeanalytics.com/valpro/, downloaded Oct. 3, 2022.
"Weiss Analytics Launches ValPro+, First AVM Powered By Cape Analytics' Instant Property Condition Assessments", Cape Analytics, Feb. 19, 2021, https://capeanalytics.com/resources/weiss-analytics-valpro-instant-property-condition-assessments/.
"Cape Analytics Now Detects Yard Debris From Geospatial Imagery", Dec. 18, 2019, https://capeanalytics.com/cape-analytics-now-detects-yard-debris-from-geospatial-imagery/.
Ali, Imtiaz, "Unsupervised video analysis for counting of wood in river during floods", Springer-Verlag, 2009, pp. 578-587 (year: 2009).
Carlberg, Matthew, et al., "Classifying Urban Landscape in Aerial Lidar Using 3D Shape Analysis", IEEE, 978-1-4244-5654-3, 2009, pp. 1701-1704 (Year: 2009).
Chen, Yixing, et al., "development of city—modeling", Energy and Buildings, 2019, pp. 252-265 (Year 2019).
Eigen, David, et al., "Depth Map Prediction from a Single Image using a Multi-Scale Deep Networ", Proceedings of Advances in Neural Information Processing Systems (NIPS), 2014.
Friedland, Carol, et al., "Integrated Aerial-Based and ground Based-Scales", ResearchGate, Feb. 9, 2015, pp. 1-7 (Year. 2015).
Jiang, Shasha, et al., "Automatic urban debris zone extraction from post-hurricane very high-resolution satellite and aerial imagery", Geomatics, Natural Hazards and Risk, 7:3, 933-952, https://www.tandfonline.com/doi/full/10.1080/19475705.2014.1003417, 2016.
Maire, Frederic, et al., "A Convolutional Neural Network for Automatic Analysis of Aerial Imagery", 2014 International Conference on Digital Image Computing: Techniques and Applications (DICTA), 8 pages (2014).
Mansouri, Babak, "Earthquake building damage detection using VHR Satellite data", Case study; Two villages hear Sarpol-e Zahab), JSEE, Jul. 29, 2018, pp. 45-55 (Year: 2018).
Moussa, A., et al., "Man-made objects classification from satellite/aerial imagery using neural networks", International Archives of the Photogrammetry, Remote Sensing and Spatial Information Sciences—ISPRS Archives, 4 pages (2010).
Muhs, Sebastian, "Automatic delineation—maps", Elsevier, 2016, p. 71-84 (Year: 2016).
Plank, Simon, "Rapid damage—Sentinel", Remote Sensing, May 28, 2014, pp. 4870-4906 (Year 2014).
Tran, Kieu, "Applying Segmentation and Neural Networks to Detect and Quantify Marine Debris From Aerial w Images Captured By an Unmanned Aerial System and Mobile Device", Aug. 2018, pp. 1-70 (Year 2018).
Yu, Bailang, et al., "Automated derivation—method", Landscape and urban planning, 2020, pp. 210-219 (Year: 2010).

* cited by examiner

METHOD AND SYSTEM FOR AUTOMATED DEBRIS DETECTION

CROSS-REFERENCE TO RELATED APPLICATIONS

This application is a continuation of U.S. application Ser. No. 17/502,825 filed on 15 Oct. 2021, which claims the benefit of U.S. Provisional Application Ser. No. 63/092,283, filed on 15 Oct. 2020, each of which is incorporated in its entirety by this reference.

TECHNICAL FIELD

This invention relates generally to the computer vision field, and more specifically to a new and useful system and method for automated debris detection.

BACKGROUND

Property conditions, especially the existence of debris, is difficult to assess in the insurance underwriting process. Insurance carriers often quote and bind policies, only to learn about condition issues upon an on-site physical inspection or, worse, following a claim. Walk-around inspections may reveal accumulated debris on the premises, presenting fire hazards, liability hazards, and visually undesirable objects. Insurance underwriting and other property valuation decisions are typically made with the best information at hand, but issues with property condition are not well represented in traditional data sources and typically are not discovered until the property is inspected, if at all.

Thus, there is a need for a new and useful system and method for automatic debris detection.

DETAILED DESCRIPTION

The following description of the preferred embodiments of the invention is not intended to limit the invention to these preferred embodiments, but rather to enable any person skilled in the art to make and use this invention.

1. Overview

Figure 1:
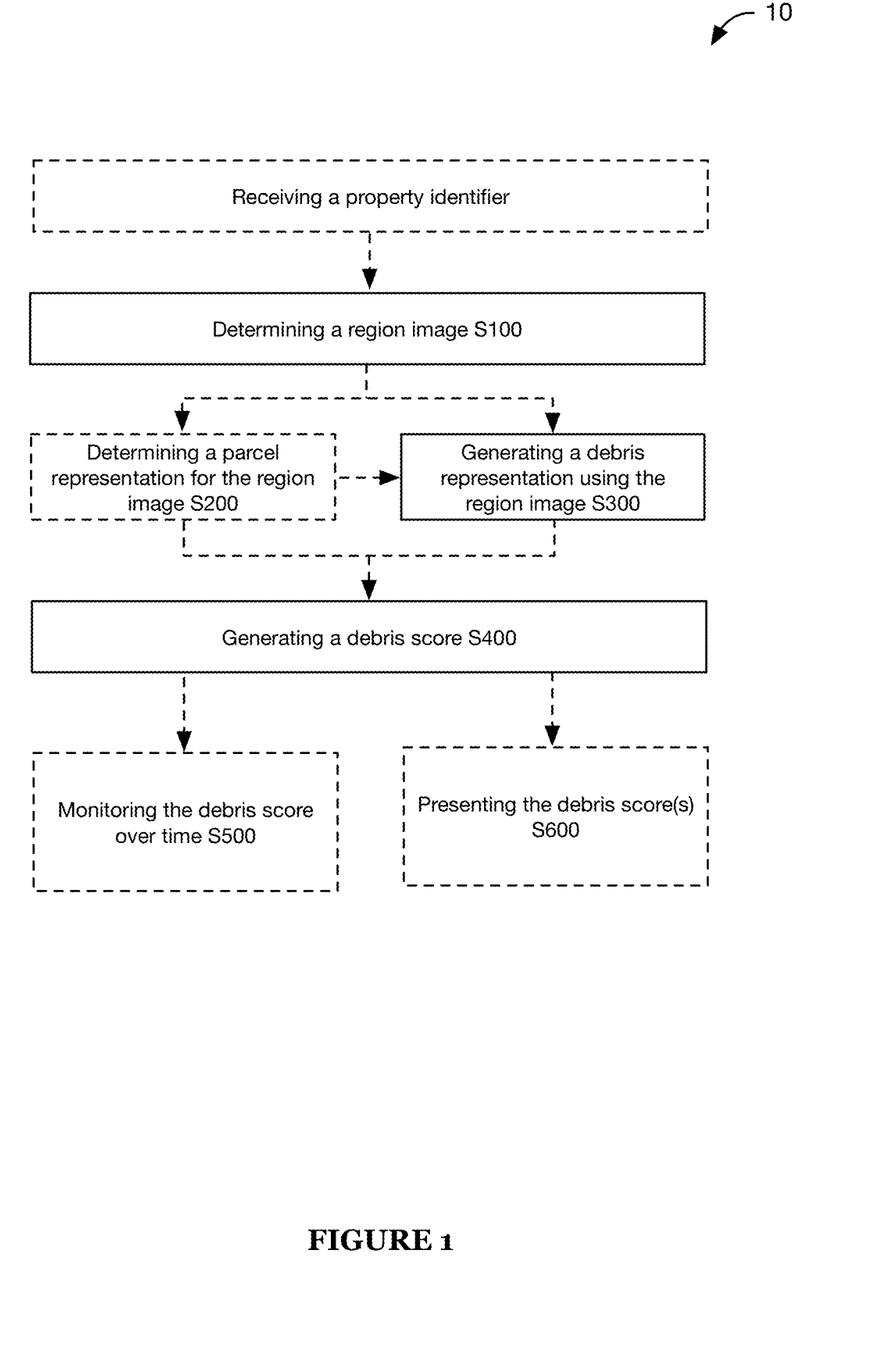
FIG. 1 depicts a schematic representation of a variant of the method.

As shown in FIG. 1, the method 10 for automatic debris detection can include: determining a region image S100; optionally determining a parcel representation for the region image S200; generating a debris representation using the region image S300; optionally generating a debris score based on the debris representation S400; optionally monitoring the debris score over time S500; and optionally returning debris information S600. However, the method can additionally or alternatively include any other suitable elements.

Figure 2:
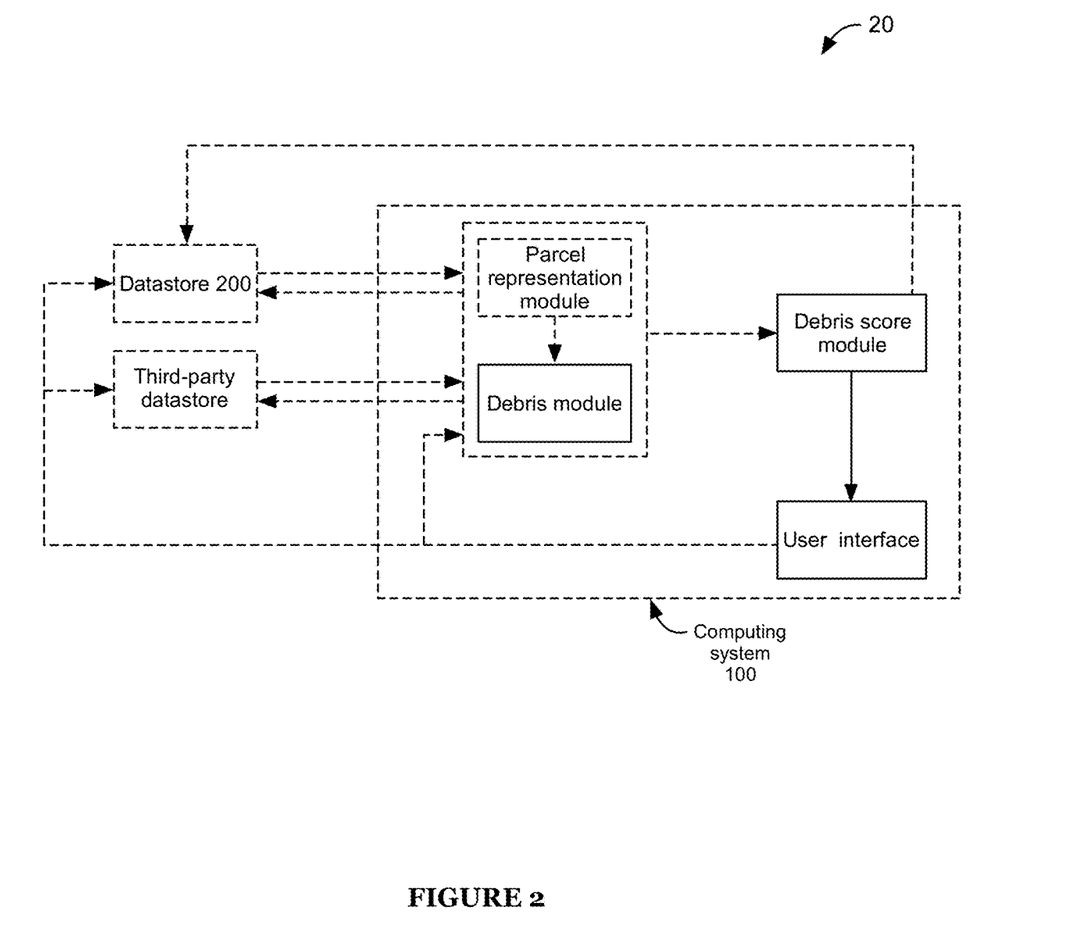
FIG. 2 depicts a schematic representation of a variant of the system.
Figure 3:
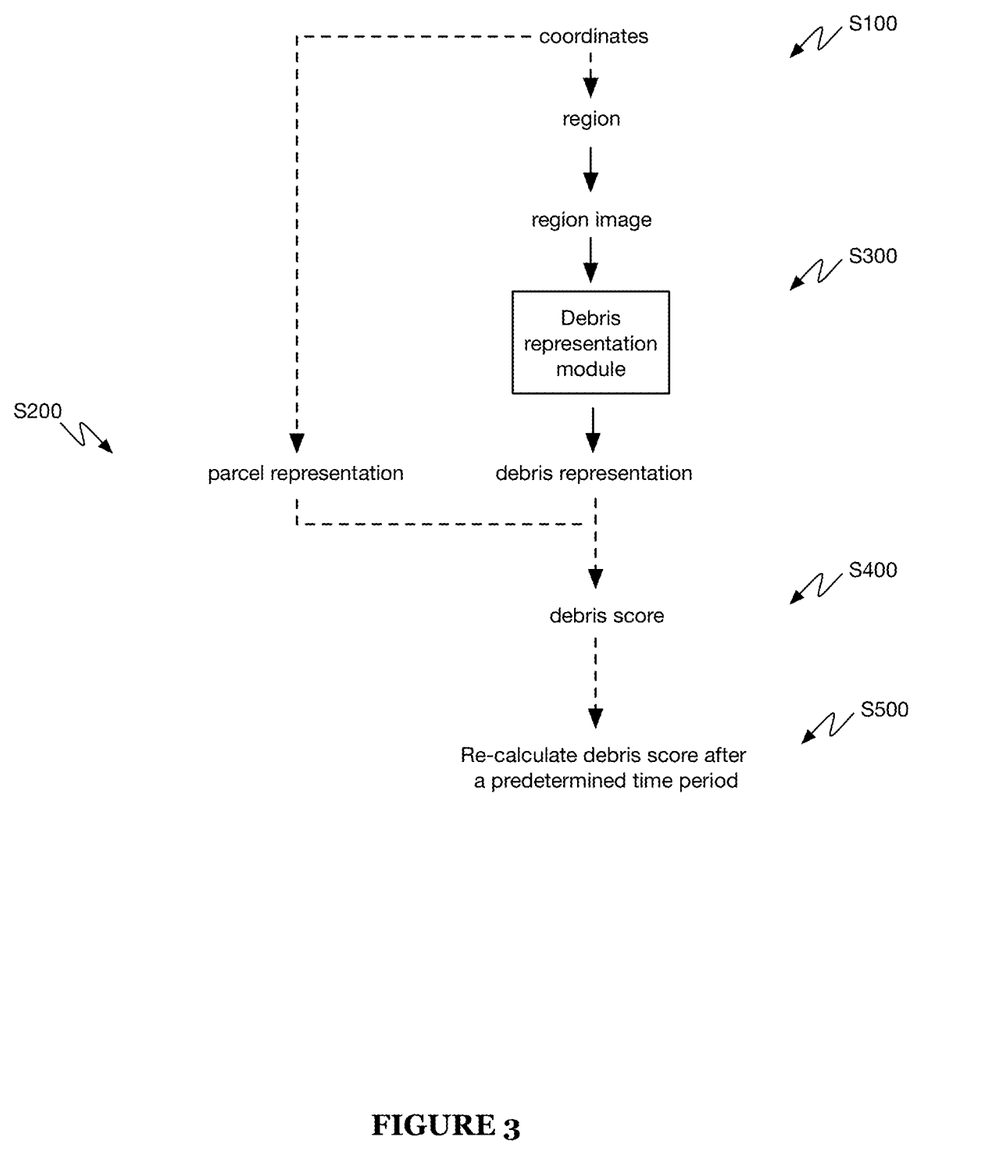
FIG. 3 depicts a variant of the method.
Figure 4:
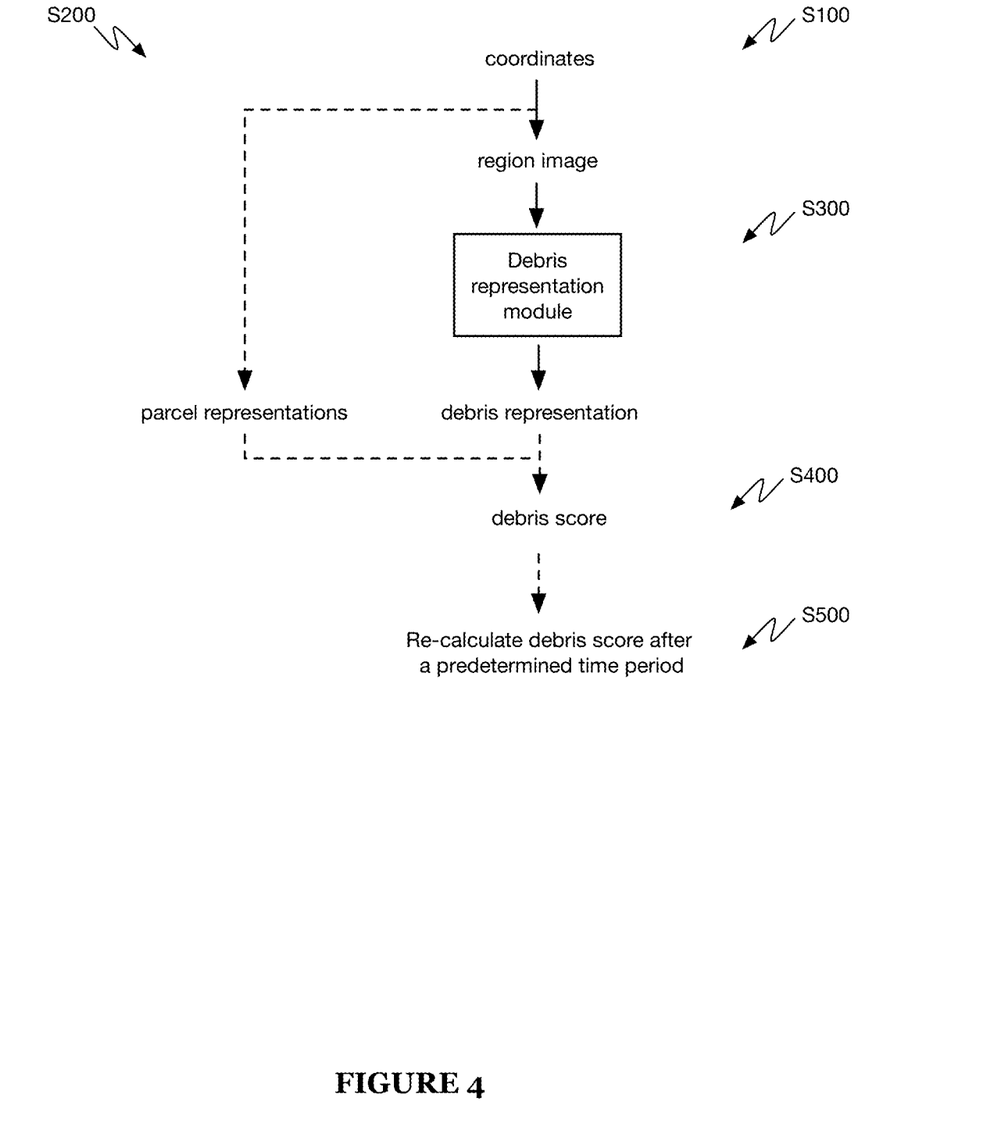
FIG. 4 depicts a variant of the method.
Figure 5:
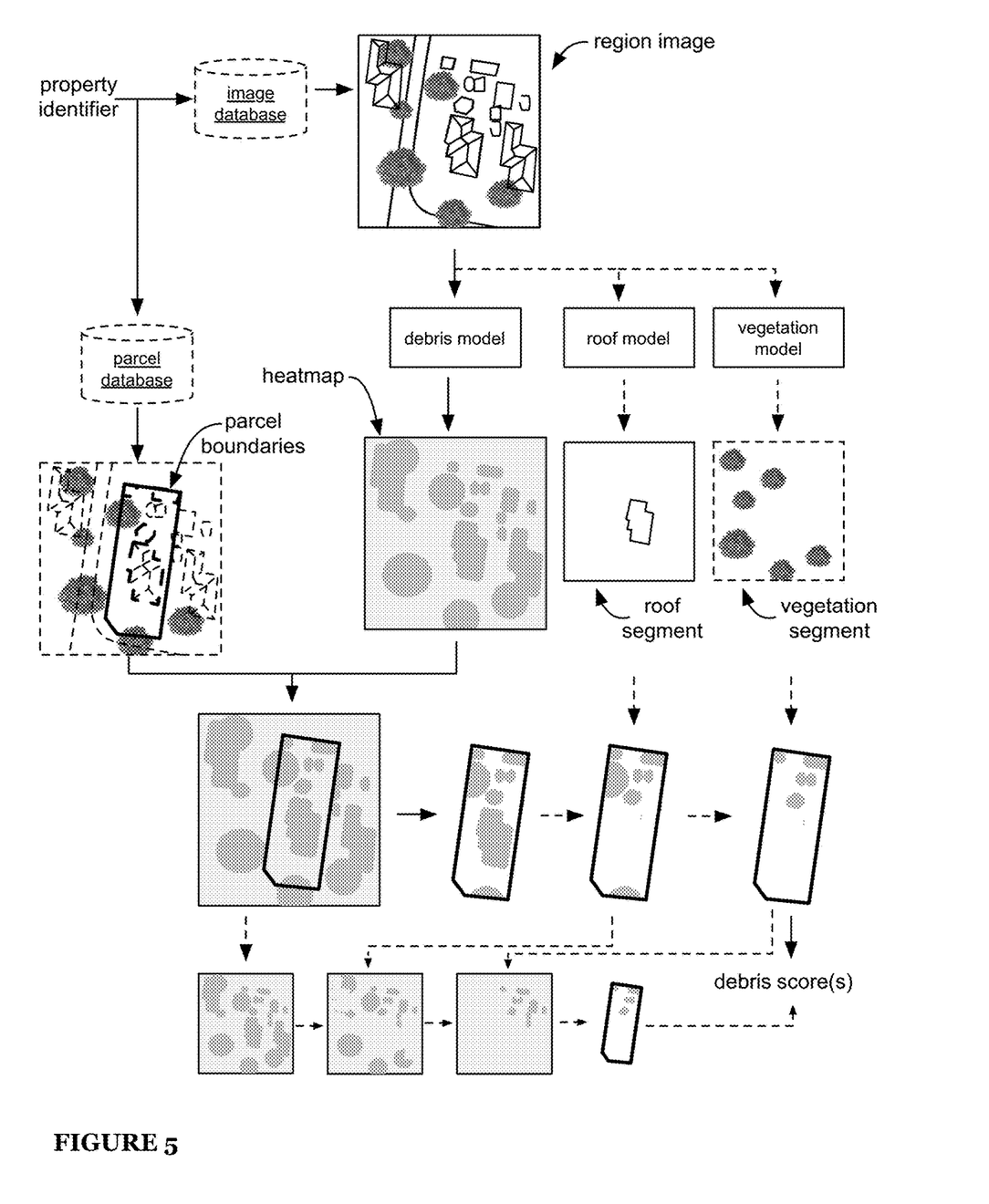
FIG. 5 depicts an illustrative representation of an example of the method.

As shown in FIG. 2, the system 20 for automatic debris detection can include one or more computing systems 100, one or more datastores 200, and/or any other components.

The system and method function to identify and analyze (e.g., score) a property's debris (e.g., yard debris, parking structure debris, and/or any other debris on a property). The property can be: residential property (e.g., homes), commercial properties (e.g., industrial centers, forest land, quarries, etc.), plots, parcels, and/or any other suitable property class.

The resultant debris information (e.g., debris score, debris representation, debris parameters, etc.) can be used as an input in one or more property models, such as an automated valuation model, a property loss model, and/or any other suitable model. The debris information can be used for property inspection (e.g., automatically sent to an inspector, such as when the value of the debris score is above or below a predetermined threshold). However, the debris information can be otherwise used.

2. Examples

In a first example, the system and method can include receiving a request including: a property identifier, such as coordinates, an address, an image (e.g., region image), a specified built structure and/or other specified property feature from a user device and/or API; optionally determining a region image associated with the property identifier (e.g., that depicts the parcel associated with the property identifier and optionally other parcels or parts of parcels); determining a debris representation (e.g., potential debris heatmap, such as values between 0-1, debris bounding boxes, etc.) using a debris representation module; and optionally determining a debris score using the debris representation.

In a first specific example, determining the debris representation can include: determining a foreground heatmap from the region image; optionally masking the heatmap with parcel boundaries associated with the property identifier (e.g., when the region image is not restricted to the parcel); and removing heatmap segments associated with known classes (e.g., roofs, vegetation, shadows, pools, driveways, etc.; determined by other classifiers, etc.). The debris scores (e.g., debris square area, debris percentage of parcel, etc.) can be determined based on the remaining heatmap segments.

Figure 7:
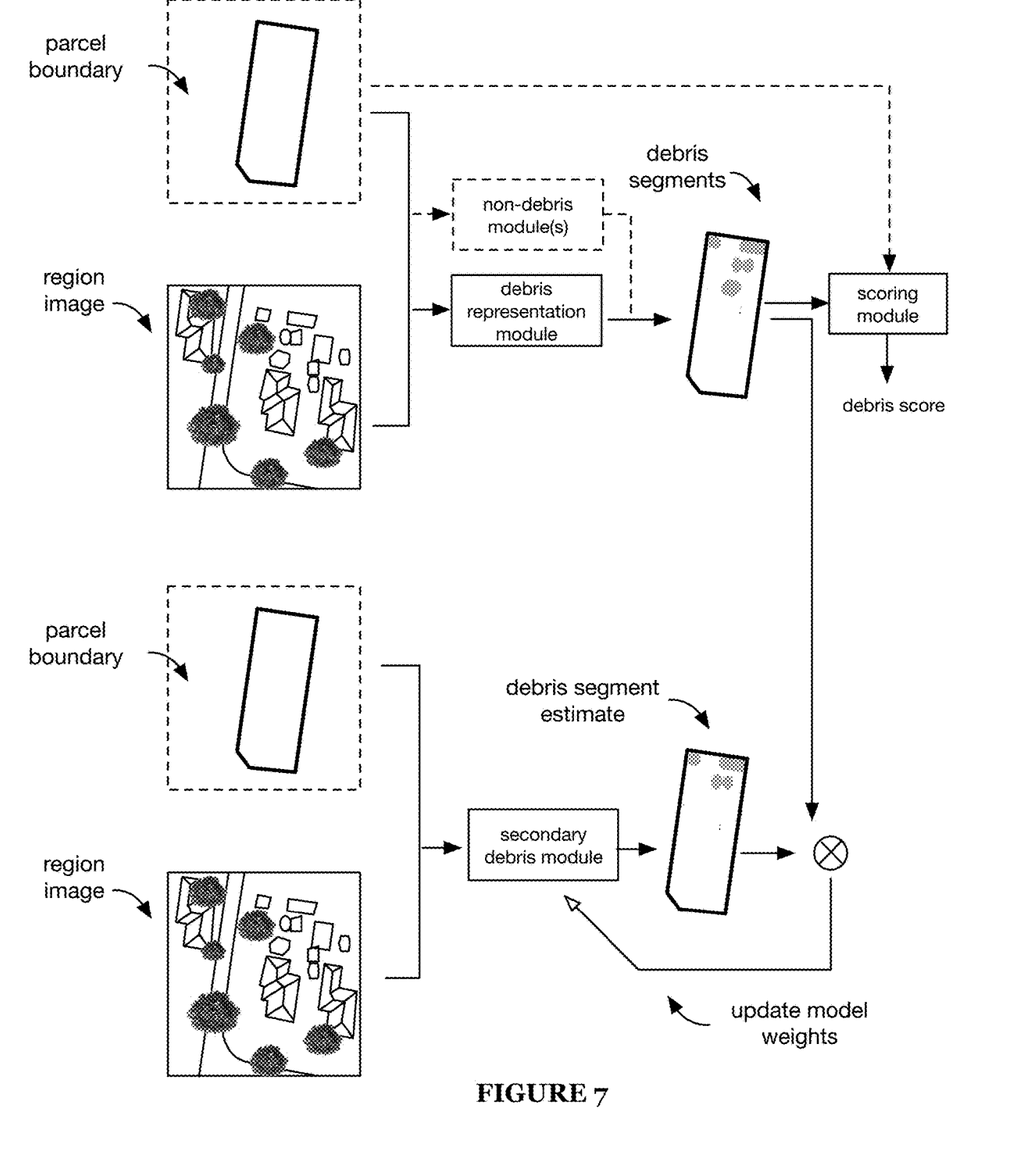
FIG. 7 is an illustrative example of training a debris model.

In a second specific example, the debris representation can be directly determined by a debris model trained to identify (e.g., classify, segment) debris within an image. The debris model can additionally or alternatively be trained to generate the debris score. The debris model can be trained on debris segments (e.g., identified using the first specific example, example shown in FIG. 7), the debris scores (e.g., determined using the first specific example), and/or otherwise trained.

3. Benefits

The method and system can confer several benefits over conventional systems.

First, the method and system can enable automatic identification of accumulations of exterior debris at one or more specific points in time, which can improve underwriting decisions and create opportunities to proactively address condition issues before they result in insurance claims or other condition-related losses.

Second, variants of the system and method avoid expensive data collection techniques, such as in-person inspections and/or buying expensive datasets. Instead, the system and method enables scalable debris analysis by using remote imagery (e.g., satellite, aerial, drone imagery, etc.).

Third, variants of the system and method return up-to-date results by using the most recent imagery for every request (e.g., collected within the last day, the last week, within the last month, within the last 3-6 months, etc.). The system and method can additionally return results for imagery taken for multiple different points in time.

Fourth, the inventors have discovered that, in some variants, debris identification can be more accurate when performed on a wide-view image of the area of interest, instead of identifying debris solely based on the image segment associated with the parcel. This is because the parcel's image segment can cut off portions of known, non-debris objects (e.g., portions of a tree), thereby resulting in said objects being erroneously classified as debris.

Fifth, the inventors have discovered that, because there is a low number of properties with yard debris and because there is a wide variety of debris that can possibly occur, the yard debris dataset can be too sparse to adequately train a debris classifier, and potentially be biased (e.g., against certain socioeconomic demographics). In these variants, the system and method can still reliably detect yard debris by detecting and removing non-debris objects from foreground objects detected in the property image, and treating the remaining foreground objects as debris.

However, the method and system can confer any other suitable benefits.

Debris can include: junk cars (e.g., vehicles surrounded by debris, on the parcel but not in the driveway, etc.), appliances, construction materials, disorganized stacks of boxes, man-made piles of indeterminate composition, and/or any other debris.

Non-debris can include property features: structures (e.g., primary structure, such as the primary residence, commercial building, etc.; roofs; etc.); secondary structure, such as an additional dwelling unit, shed, garage, paved surfaces, water features, furniture (e.g., patio and/or lawn chairs, hammock, trampoline, etc.), vegetation excluding fallen trees (e.g., maintained gardens, grass, trees, etc.), and/or any other non-debris. Non-debris can exclude any features that do not have a positive height (e.g., holes, pools, etc.) or are themselves surfaces (e.g., driveways, sidewalks, patios, decks, etc.), but can additionally or alternatively include said features.

4. System

The method is preferably performed using the system 20, including: one or more computing systems 100, one or more datastores 200, and/or any other suitable components.

The computing system can include a remote computing system (e.g. one or more servers), a user device (e.g., smartphone, laptop, desktop, etc.), and/or other computing system. The computing system can be used with a user interface, wherein the computing system can receive an identifier from the user device which can be used to retrieve a region image from the datastore. Additionally or alternatively, the computing system can receive a region image from the datastore in response to the datastore receiving an identifier from the user device.

In some embodiments, the computing system can include a remote computing system and a user device that interfaces with the remote computing system via an API. In some embodiments, the computing system can include a remote computing system that interfaces with a third-party via an API.

The computing system can include one or more modules. The one or more modules can include: a debris module, a parcel representation module, a set of non-debris modules, and/or any other suitable module. The debris module functions to identify debris segments within an image, and can optionally analyze the debris segments (e.g., determine a debris score based on the debris segments). The debris module can include (and/or be split into) a debris representation module (e.g., to determine one or more debris representations), a debris score module, and/or any other suitable debris module. The parcel representation module functions to determine one or more parcel representations (e.g., parcel boundaries, parcel masks, etc.) of a property parcel (e.g., land parcel).

Each module can include one or more: classification models, neural networks, regression models, segmentation models, sets of equations, sets of heuristics or rules, and/or be otherwise constructed. Alternatively, classification models can be separate from the modules. The modules can receive as input the region image, optionally depth information (e.g., a 3D point cloud, a digital surface map, a digital elevation map, etc.), and/or any other suitable information of the region. The modules preferably output one or more representations, but can additionally or alternatively output one or more classes (e.g., for the image, for a pixel, for an image segment, etc.), one or more scores, and/or any other suitable information. The representation is preferably a heatmap, but can additionally or alternatively be a mask, one or more segments, one or more boundaries, a score, and/or any other information. However, the modules can include other model types.

The modules can include machine learning models, sets of rules, heuristics, and/or any other suitable model. The modules can be neural networks (e.g., DNN, CNN, RNN, etc.), decision trees, SVMs, regressions, Naïve Bayes, clustering algorithms (e.g., k-nearest neighbors, k-means, etc.), and/or any other suitable machine learning model. The modules can be semantic segmentation models, instance-based segmentation models, object detection models (e.g., YOLO), and/or any other segmentation model. The modules can be binary classifiers (e.g., roof vs background, ground vs. non-ground, shadow vs. non-shadow, vegetation vs. non-vegetation, etc.), a multi-class classifier (e.g., multiple labels such as roof, ground, vegetation, shadow, etc.), and/or any other suitable classifier. During inference, the method can: use the same trained segmentation model in all contexts, selectively use the trained segmentation model based on the location context, and/or otherwise use the trained segmentation model. Examples of location context include: location information (e.g., city, neighborhood, street, etc.); zoning; developed environment class (e.g., urban, suburban, rural, exurban, etc.); average distance between buildings (e.g., determined based on the parcel data); debris exceeding a predetermined percentage threshold; predetermined object presence in the image; and/or other contextual parameters.

The modules can be trained using supervised learning (e.g., trained using training data), unsupervised learning, semi-supervised learning, and/or any otherwise trained. The training data can be generated by the system and method and/or generated separately.

The system can be used with region imagery depicting all or a portion of a parcel, multiple parcels, and/or any other suitable imagery.

The system can include or be used with one or more datastores, which can store the region imagery, parcel representations, and/or any other information. The datastore can be queried to retrieve the region imagery, parcel representations, and/or any other suitable information used to perform the method. The query can include geographic coordinates, an address, and/or any other property identifier (e.g., used to identify a parcel and/or group of parcels).

The region imagery, parcel representation, non-debris representation, and/or other information can be associated with a property identifier, can be georeferenced (e.g. associated with one or more geographic coordinates), and/or associated with any other suitable information. The property identifier can include: an address, a set of geographic coordinates, a landmark name, a lot number, a parcel number, a location identifier (e.g., Google Plus Codes™, Geohashes™, Place Key™, etc.), and/or any other suitable location identifier.

However, the system can include any other suitable components.

5. Method

The method for automatic debris detection can include: determining a region image S100; optionally determining parcel representations associated with the property identifier S200; generating a debris representation using the region image S300; optionally generating a debris score based on the debris representation S400; optionally monitoring the debris information over time S500; and optionally returning debris information S600. However, the method can additionally or alternatively include any other suitable elements.

The method can be performed for one or more properties (e.g., in parallel, in series, etc.). Examples of properties can include: a parcel of land, a built structure (e.g., a building, a pool, accessory structures such as decks, etc.), and/or any other suitable property. For example, the method can be performed for a single property, identified in a request. In a second example, the method can be performed for a plurality of properties (e.g., in a batch), wherein a different instance of the method is applied to each property within the plurality (e.g., property appearing in a region image, property identified in a list, etc.). The resultant debris information can be stored in association with the property identifier for the respective property.

The method is preferably performed by the system discussed above, but can be otherwise performed.

All or portions of the method can be performed when a debris information request is received for one or more properties, when a new region image is received, and/or at any other suitable time. The debris information can be determined in response to the request, be pre-calculated, and/or calculated at any other suitable time. The debris information can be returned (e.g., sent to the user) in response to the request.

5.1 Determining a Region Image S100.

Determining a region image S100 can function to determine an image for the debris model. The region image can depict a property feature, debris, and/or any other elements. The region image can optionally be determined based on a received property identifier (e.g., address, location, latitude and longitude coordinates, etc.), such as received from a user device or an API. The region image can be received from the datastore that stores region imagery and/or retrieved from the datastore, such as using a property identifier. The region image can be imagery of the parcel associated with the property identifier, imagery of multiple parcels that include the parcel associated with an property identifier, and/or any other image.

The region image can be remote imagery (e.g., aerial imagery, etc.), be crowdsourced for a geographic region, or other imagery. Remote imagery can include imagery captured using: drones; aircraft (e.g., fixed-wing, rotary-wing, etc.); balloons; satellites; terrestrial vehicles; user devices (e.g., smartphones, augmented reality devices, glasses, etc.); and/or otherwise captured. The region image can depict a geographic region larger than a predetermined area threshold (e.g., average parcel area, manually determined region, image-provider-determined region, etc.), a large-geographic-extent (e.g., multiple acres that can be assigned or unassigned to a parcel), encompass one or more regions, such as parcels, and/or any other suitable geographic region. The region image can include top-down views of the region (e.g., nadir images, panoptic images), but can additionally or alternatively include views from other angles (e.g., oblique imagery, street view imagery) and/or other views. The region image is preferably 2D, but can additionally or alternatively be 3D and/or have any other suitable dimension. The region image can be associated with depth information (e.g., terrain information, property feature information, etc.), and/or other information or data. The region images can be red-green-blue (RGB), hyperspectral, multispectral, black and white, IR, NIR, UV, and/or captured using any other suitable wavelength. The region image is preferably orthorectified, but can be otherwise processed. The region image can additionally or alternatively include any other suitable characteristics.

The region image can be associated with geographic data; time data (e.g., recurrent time, unique timestamp); and/or other data. The region imagery is preferably pixel-aligned with geographic coordinates, but can be offset, aligned within a threshold margin of error, or otherwise aligned. Examples of geographic data can include: a geolocation (e.g., of an image centroid, such as geographic coordinates); a geographic extent (e.g., area, range of geographic coordinates, etc.); municipal labels (e.g., set of addresses, a set of parcel identifiers or APNs, counties, neighborhoods, cities, etc.); and/or other geographic data.

In a first variant, the method can include receiving an address from a user device and using the address to retrieve a region image (e.g., from a third-party API, from a database of region images, etc.), wherein the region image encompasses the property identified by the address.

In a second variant, the region image can be determined in response to: determining a geographic descriptor associated with the property identifier, transmitting the descriptor to a third-party and receiving the region image associated with the geographic descriptor. The geographic descriptor can include: a geographic coordinate (e.g., determined using conventional geocoding methods), a parcel identifier, a municipal identifier (e.g., determined based on the ZIP, ZIP+4, city, state, etc.), or other descriptor.

In a third variant, the region image can be determined in response to querying the datastore, wherein the query can include the address and/or the geographic descriptor.

In a fourth variant, S100 includes: receiving the property identifier, determining a set of geolocations (e.g., a geofence, the parcel boundaries, etc.) associated with the property identifier, retrieving images encompassing the geolocations, and optionally stitching the images together to form the region image. The images can be: contemporaneously sampled images of the geolocations (e.g., sampled in the same pass), wherein the geolocations do not appear in the same image frame; images from multiple timepoints (e.g., different times of day, different days of the week, etc.), wherein different portions of the property are occluded in each image; and/or otherwise related.

However, the region image can be otherwise determined.

5.2 Determining a Parcel Representation for the Region Image S200.

Determining a parcel representation for the region image S200 can function to determine a subregion associated with the property's parcel and/or surrounding a property feature, such that the debris analysis is limited to the property's debris. The parcel representations can be used to segment the region image (e.g., before S300, such that the region image only represents the parcel), used to mask the debris representation, used to calculate the debris score (e.g., when the debris score is representative of the proportion of a parcel covered by debris), and/or otherwise calculated. The parcel representation preferably represents the property parcel, but can additionally or alternatively represent a geographic region associated with a property or built structure (e.g., region surrounding the built structure, patio associated with the built structure, etc.), represent a larger or smaller geographic region, and/or represent any other suitable region.

The parcel representations can include polygon geometries, masks, geofences, values, and/or any other suitable information. The parcel representations can be binary masks and/or any other labelled mask. The parcel representations can include: a parcel boundary mask, a vegetation mask, shadow masks, a primary structure mask (e.g., primary residence and/or primary building), secondary structure masks (e.g., guest house, pool house, gazebo, shed, any other structure separate from the primary structure, and/or not separate from the primary structure, such as a garage, attached shed, etc.), parcel feature masks (e.g., pool, court, driveway, vegetation, etc.), and/or any other suitable mask. The parcel representations can be determined after S300, concurrently with S300 (e.g., using the same or different image or data source), before S300, and/or determined at any other time.

In a first variation, the parcel representations can be determined using the parcel representation module (e.g., from municipal parcel data, architectural diagrams, etc.).

In a second variation, the parcel representations can be retrieved from the datastore (e.g., the parcel representations can be predetermined and stored in the datastore).

Figure 6:
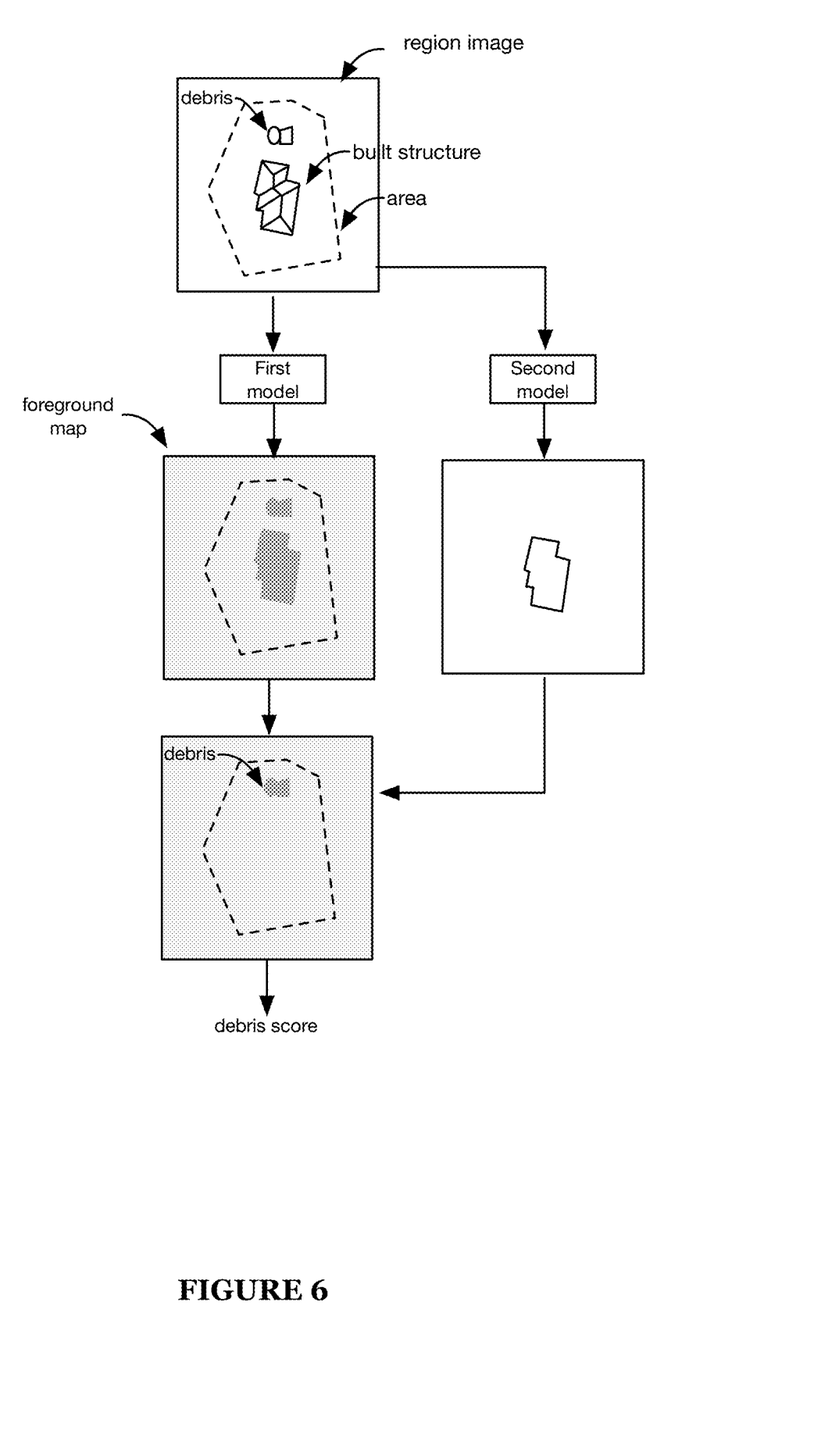
FIG. 6 depicts an embodiment of the method.

In a third variation, the parcel representation can be defined by an area whose boundary is a predetermined distance from (and/or geofence around) a predetermined location (e.g., primary structure, parcel centroid, etc.) (e.g., as shown in FIG. 6). The predetermined distance can be: manually specified, determined based on computational constraints, and/or otherwise determined.

In a specific example, the parcel boundary representation can be determined based on the parcel area. When the parcel area is larger than a threshold size, a subset of the parcel can be used as the parcel boundary (e.g., within a predetermined distance of the centroid of the primary structure, such as within 10 feet, 20 feet, 30 feet, 50 feet, etc.). The cropped parcel boundary can be circular, square, rectangular, irregular, and/or any other suitable shape.

However, the parcel representations can be otherwise determined.

5.3 Generating a Debris Representation Using the Region Image and the Parcel Representations S300.

Generating a debris representation using the region image and the parcel representations S300 can function to determine debris and/or non-debris segments in the region image.

The debris representation is preferably a mask, but can additionally or alternatively be a heatmap, set of segments (e.g., image segments), a semantic segmentation (e.g., with pixel blobs associated with a debris tag), a set of bounding boxes around the debris (e.g., polygons, rectangles, etc.), and/or any other representation. The debris representation can be determined after determining the region image, optionally after determining the parcel representations, concurrently with determining the parcel representations, before determining the parcel representations, and/or performed at any other time. The debris representation is preferably determined by the debris model, but can be additionally or alternatively determined by any other model, rule, heuristic, or otherwise determined. The debris model is preferably a binary classifier (e.g., outputting the probability of whether a pixel represents debris or not), but can alternatively be a multiclass classifier (e.g., classifying each pixel with a debris type), an object detector (e.g., trained to detect yard debris), and/or other model.

Optionally the debris representation can include labels for non-debris objects (e.g., a separate label for roof, pool, etc.). The non-debris objects can be determined by the debris model, by a separate non-debris model (e.g., a version of the debris model trained to label non-debris objects), and/or any other suitable model. The non-debris segments can optionally be pre-determined and retrieved from the datastore (e.g., calculated during S200), determined in parallel with debris segmentation, and/or otherwise determined.

In a first variant, the debris module can receive an input region image and/or depth information that includes multiple parcels (e.g., determined in S100). The output of the debris module can include a mask of debris segments across the multiple parcels (e.g., each pixel is assigned a 1 if it is debris and 0 otherwise). In a specific example, the debris module outputs a heatmap with debris probabilities assigned per pixel, which is then thresholded (e.g., at a predetermined probability cutoff) to generate the mask. The parcel segment can optionally be isolated from this mask using the parcel representation.

In a second variant, the debris module can receive as input a region image and/or depth information of the associated parcel area (e.g., determined by combining the region image and the parcel boundary representation determined in S200, such as by masking out all areas of the region image excluding the parcel area defined by the parcel boundaries). The output of the debris module can include a binary debris mask (e.g., each pixel is assigned a 1 if it is debris and 0 otherwise) and/or any other suitable representation.

In a third variant, the debris representation can be cooperatively formed from representations of one or more debris classes. In this variant, one or more debris modules can identify (e.g., segment, semantically segment) one or more classes of debris (e.g., trash, fallen vegetation, engines, rusted cars, etc.). The segments output by the debris modules can be aggregated to form the debris representation.

In a fourth variant, the debris module can determine a foreground map by segmenting ground pixels from non-ground pixels (e.g., using background/foreground segmentation), wherein the non-ground pixels can represent debris. The foreground map can be determined based on the region image, depth information, and/or any other suitable information.

In a fifth variant, the debris representation (e.g., output by the fourth variant) can be modified to remove non-debris objects, such as to label and/or correct debris and/or non-debris classifications in the debris representation (e.g., when a ground classifier is used as the debris model, to remove non-debris objects, etc.) and/or provide any other functionality. The modified representation can be determined by subtracting parcel masks or other masks (e.g., vegetation masks, shadow masks, primary structure mask, secondary structure masks, and/or other parcel feature masks, etc.) retrieved from storage or determined by the computing system (e.g., from the same or contemporaneously-sampled images) from the debris representation, wherein S400 is performed on the resultant representation. This can be performed before or after parcel region isolation.

In this variant, the method can include: determining a foreground map based on the region image using a first model of the computing system (e.g., a first classification model); determining set of non-debris representations within the region image using a set of non-debris models (e.g., secondary classification models); and identifying debris within the region image.

The set of non-debris representations (e.g., property features) can include masks (e.g., feature masks), maps, heatmaps, segments, and/or other representations associated with one or more non-debris classes of objects (e.g., non-debris features). For example, the non-debris representations can include: built structure maps, vegetation maps, pool maps, umbrella maps, and/or other spatial representations of non-debris. The non-debris representations can be determined by: a single non-debris module (e.g., configured to identify a predetermined set of non-debris), a different non-debris module for each non-debris class (e.g., a built structure classifier, a vegetation classifier, etc.), and/or any other suitable set of modules. The non-debris representation can be determined based on a region image. The non-debris region image can be the region image from S100, the same region image used to determine the debris representation, a different region image from S100 or debris representation determination, a region image of the same region or depicting the same property, and/or be any other suitable region image. Alternatively, the non-debris representation can be retrieved from a database, or otherwise determined. The non-debris representation can be determined as part of S300, determined before S300, and/or otherwise determined.

Identifying debris in the region image can include: optionally isolating the parcel in the foreground map using the parcel representation (e.g., masking out parcels of the foreground map not represented by the parcel representation), and removing the non-debris features (e.g., property features, etc.) by subtracting the non-debris representation (e.g., non-debris feature mask(s)) from the foreground map (e.g., re-labelling the pixels as background, masking out the pixels associated with the non-debris feature mask(s)), wherein the remaining foreground segments (e.g., pixels) can be representative of debris. Identifying debris can optionally include removing foreground segments (e.g., debris segments) satisfying a set of conditions (e.g., smaller than a threshold area, having less than a threshold dimension, etc.). However, the debris can be otherwise identified in the region image.

In the above variants, when depth is used, the depth information can be used to classify pixels as foreground (e.g., debris) or background (e.g., non-debris). In a first example, the depth information can be used to determine ground pixels in a region image. In a second example, the depth information can be used to determine vegetation and/or property features in a region image (e.g., using heuristics, algorithms, and/or rules for processing the depth information).

Additionally or alternatively, the debris representation can be determined from the depth information, wherein the debris representation can be 3D (e.g., include a 2D footprint and height). In this variant, the depth information can be intersected with the 2D debris representation (e.g., the depth information can be masked with the 2D debris representation, etc.), to identify the points, voxels, mesh cells, and/or other depth units associated with the 2D debris segments.

However, the depth information can be otherwise used.

In some variants, certain classes of debris can be selectively excluded from the debris representation. These variants can leverage debris modules that can identify (e.g., segment, semantically segment) a given debris class, wherein the output segments can be removed from the overall debris representation. Alternatively, the results of those debris modules can be omitted from the debris representation (e.g., in variants where the debris representation is aggregated from multiple debris classes). Certain debris classes can be excluded when: the property is associated with the debris class (e.g., the property is a car junkyard, the property is a used car lot, the property is an outdoor engine storage space, etc.), when a user requests that the debris class be omitted, or when any other suitable exclusion condition is met. The property-debris class association can be determined: manually, from a business listing, from the parcel zoning, the property zoning (e.g., single family home, multi-family home, commercial, etc.), and/or otherwise determined.

However, the debris representation can be otherwise determined.

The method can optionally include determining debris parameters. Examples of debris parameters can include: debris composition, debris location, debris size, debris volume, debris class, debris density, debris temperature, debris formation rate, and/or any other suitable parameter. The debris parameters can be determined from the debris representation, from the depth information (e.g., masked with the debris representation), and/or otherwise determined. For example, the debris area can be calculated from the size of the debris representation. In another example, the debris volume can be determined from the depth map or point cloud segment overlapping the debris representation. However, the debris parameters can be otherwise determined.

The method can optionally include determining a debris class for the debris. The debris class can be determined from the debris representation, from the depth map, and/or from any other suitable information. The debris class is preferably determined by a model trained to classify the debris (e.g., debris classifier), but can be manually or otherwise determined. The model can be a binary model (e.g., specific to a debris class), a multiclass model (e.g., trained to classify the debris as one or more of a set of potential debris classes), and/or any other suitable model. Examples of debris classes can include: flammable/nonflammable; easily mitigated/not easily mitigated; composition (e.g., vegetation, machinery, metal, plastic, etc.), and/or any other suitable class.

However, any other suitable debris information can be determined.

5.4 Generating a Debris Score Based on the Debris Representation S400.

The method can optionally include generating a debris score using the debris representation S400 can function to determine an amount of debris on a parcel. The debris score can be stored in the datastore (e.g., to enable score monitoring in S500) or not stored. The debris score can optionally be presented to a user.

The debris score can represent an area of the parcel covered by debris, the area of the parcel covered by debris divided by the parcel size (e.g., percent of the parcel covered by debris; percent of the parcel representation intersecting the debris representation; etc.), the area surrounding a structure of a predetermined radius that is covered by debris, the volume of debris (e.g., determined from a 3D debris representation), ratio of the primary building or built structure area to the debris area, proximity of the debris to a built structure (e.g., proximity of any debris to a primary building, proximity of the debris centroid to the built structure, etc.), the typicality of the property's amount of debris for the property's area (e.g., normalized by the debris scores for other properties in the neighborhood), the quality of the debris (e.g., level of degradation, type of debris, etc.), the location of the debris (e.g., driveway debris may result in a higher score than backyard debris; determined by intersecting the debris representation with a driveway representation determined by a driveway module, etc.), the debris' temporal change (e.g., aggregation over time, change over time, duration, etc.; determined from a series of images of the same property), and/or any other suitable measurement. The debris score can be a percentage (e.g., of the parcel, of the unbuilt square footage); a measurement (e.g., total square area, number of debris piles, etc.); distribution metric (e.g., based on proximity to the primary structure); a binary score (e.g., in or on a property feature or not, such as inside a water feature, on a paved surface, etc.); a classification (e.g., high amount of debris, medium amount of debris, low amount of debris, etc.), a comparison to a reference area score (e.g., the difference to a reference score, a percentile for the reference area, etc.), wherein the reference area can be: neighborhood, geofenced area, town, city, county, state, province, country; a proximity to a built structure and/or other property feature, and/or any other suitable value. The debris score is preferably generated using the debris representation (e.g., including only the parcel region; including multiple parcel regions; etc.), the parcel representation (e.g., parcel masks, boundaries, etc.), and/or any other information.

In a first variant, the debris score can be calculated by converting the area of the debris, represented by the modified and/or original debris representation, into a measurement (e.g., square footage, square meters, etc.). This can be done based on a known square-area to pixel mapping, or otherwise determined.

In a second variant, the debris score can be calculated by converting the area of the debris represented by the modified and/or original debris representation into a measurement and dividing the amount by the size of the parcel.

In a third variant, the debris score can be calculated by converting the area labelled as ground into the debris score. Optionally, non-debris objects can be removed from the debris representation before calculating the debris score. Optionally, parcel representations can be combined with the debris representation to more accurately calculate the debris score (e.g., based on the debris representation and one or more parcel representations).

In a fourth variant, a mask of a property feature (e.g., calculated in S300) can be used to determine an instance of the property feature in the region image and/or foreground map, and the debris score can be calculated based on the debris within the area of the region image defined by the mask of the property feature.

In a first example, the property feature can be a water feature on the parcel and the debris score can be calculated for the debris in the water feature (e.g., debris in a pool, debris in a lake, debris in a fountain, debris in a pond, etc.).

In a second example, the property feature can be a paved surface (e.g., driveway, walkway, etc.) and the debris score can be calculated based on the debris that is on the paved surface.

In a fifth variant, the debris representation can be fed as input into a classification model of the computing system and the debris score is output by the classification model. The classification model can be trained on a set of debris representations, each associated with a debris score. In a specific example, the classification model can be a regression model.

However, the debris score can be otherwise determined.

5.5 Monitoring the Debris Information Over Time S500.

The method can optionally include monitoring the debris information over time S500, which can function to determine changes to the property and/or debris over time. The monitored debris information can include: the debris score, the debris representation, the debris parameters, and/or other information. The changes can be quantified (e.g., rate of change over time), and can be used in property analyses or otherwise used. The changes can include: more debris accumulation over time, less debris accumulation over time, debris relocation over time (e.g., relocation of the same debris instance, relocation of different debris classes, relocation of a centroid of the debris, etc.), change in debris composition over time, debris residency duration (e.g., how long the debris remains on the parcel, which can be indicative of built structure construction or modification), and/or any other suitable set of changes.

S500 can include redetermining (e.g., recalculating) the debris information (e.g., using S100-S300, S100-S400, etc.) and storing the debris information in association with a timestamp (e.g., of the region image) and the property identifier. The debris information can be re-calculated periodically (e.g., every month, every 3 months, every 6 months, every 12 months, every new image for the property, etc.), or determined at any other suitable frequency. The debris information can be sent to the user in response to an API query, recorded in the database associated with as an entry associated property identifier, sent to a third party system, and/or otherwise used. The debris information can be monitored using one or more time series processes to determine historical change over time, to predict accumulation of debris over time, and/or otherwise used. The time series processes can include: recurrent neural networks, autoregression, moving average, autoregressive moving average, autoregressive integrated moving-average, seasonal autoregressive integrated moving-average, vector autoregression, vector autoregression moving-average, exponential smoothing, and/or any other suitable process. However, the debris information can be otherwise monitored.

5.6 Returning the Debris Score S600.

The method can optionally include returning the debris information S600, which can function to provide debris information to an endpoint (e.g., the requesting endpoint). For example, S600 can function to return the debris information in response to a request, store the debris information in the datastore for future retrieval, and/or provide any other functionality. The debris information can include: the debris score (e.g. determined in S400 and/or S500), the debris representation (e.g., determined in S300), the debris class (e.g., wherein the debris representation and/or image segment corresponding to debris is fed to a debris classification model), the debris parameters, and/or other debris information.

The debris information can be presented as part of a code block (e.g., data returned in response to an API request), presented in a user interface (e.g., in a user facing application, such as on a user device), and/or otherwise returned. The debris information can be automatically returned in response to an event, or returned at any other suitable time. The event can include the debris score falling above or below a predetermined threshold, a re-calculation of the debris score (e.g., when updated imagery is received by a system for properties), receipt of a debris information request, and/or any other suitable event. The debris information can be automatically returned to a third-party system (e.g., to update models and/or model outputs that are generated based on the debris score), to the datastore, to a third-party datastore, to a user, and/or to any other suitable entity. However, the debris information can be otherwise returned.

Different processes and/or elements discussed above can be performed and controlled by the same or different entities. In the latter variants, different subsystems can communicate via: APIs (e.g., using API requests and responses, API keys, etc.), requests, and/or other communication channels.

Alternative embodiments implement the above methods and/or processing modules in non-transitory computer-readable media, storing computer-readable instructions that, when executed by a processing system, cause the processing system to perform the method(s) discussed herein. The instructions can be executed by computer-executable components integrated with the computer-readable medium and/or processing system. The computer-readable medium may include any suitable computer readable media such as RAMs, ROMs, flash memory, EEPROMs, optical devices (CD or DVD), hard drives, floppy drives, non-transitory computer readable media, or any suitable device. The computer-executable component can include a computing system and/or processing system (e.g., including one or more collocated or distributed, remote or local processors) connected to the non-transitory computer-readable medium, such as CPUs, GPUs, TPUS, microprocessors, or ASICs, but the instructions can alternatively or additionally be executed by any suitable dedicated hardware device.

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the preferred embodiments of the invention without departing from the scope of this invention defined in the following claims.

We claim:

1. A method for automatic debris detection comprising:
    determining a set of region measurements depicting a set of properties, wherein the region measurement comprises depth information;
    determining a foreground representation using the depth information to differentiate terrain from foreground objects;
    determining a non-debris representation based on the set of region measurements, wherein determining the non-debris representation comprises identifying instances of a property feature within the set of region measurements;
    identifying debris for a property of the set of properties based on the foreground representation and the non-debris representation; and
    generating a debris score for the property based on the identified debris.

2. The method of claim 1, wherein the debris is further identified using a parcel boundary associated with the property.

3. The method of claim 1 wherein the debris score is a percentage of a parcel covered by the identified debris.

4. The method of claim 1, wherein the debris score is an area of the identified debris.

5. The method of claim 1, wherein a debris class for the identified debris is determined using a classifier.

6. The method of claim 1, wherein the debris score is used as an input to an automated valuation model.

7. The method of claim 1, wherein the debris score is returned in response to a third-party request.

8. The method of claim 1, wherein the property comprises a built structure, wherein a different zone is determined for the built structure, wherein a different debris score is generated for each zone.

9. The method of claim 1, wherein the method is repeated when an updated region measurement depicting the property is received.

10. The method of claim 1, wherein the non-debris representation comprises a vegetation map, wherein the debris is further identified by subtracting the vegetation map from the foreground representation.

11. The method of claim 1, further comprising automatically sending the debris score to an inspector when a value of the debris score satisfies a threshold.

12. A system for automatic debris detection, comprising:
    a non-transitory computer readable medium; and
    a processing system coupled to the non-transitory computer readable medium, the processing system configured to:
        receive a set of region measurements depicting a set of properties;
        determine a foreground representation based on the set of region measurements;
        determine a built structure map based on the set of region measurements;
        identify debris for a property of the set of properties, comprising subtracting the built structure map from the foreground representation; and
        generate debris information for each property of the set of properties based on the identified debris.

13. The system of claim 12, wherein the set of region measurements are determined based on a set of property identifiers.

14. The system of claim 12, wherein the debris information comprises a debris score.

15. The system of claim 12, wherein the debris information for the property is stored with a property identifier for the property and a timestamp associated with the set of region measurements.

16. The system of claim 12, wherein the processing system is further configured to determine a vegetation map from the set of region measurements, wherein the debris is further identified based on the vegetation map.

17. A method, comprising: determining a value for a property based on debris information using a model, wherein the debris information is determined by:
- determining a foreground representation using depth information from a set of region measurements depicting the property;
- determining a non-debris representation based on the set of region measurements, wherein the non-debris representation comprises a vegetation map;
- identifying debris for the property based on the foreground representation and the non-debris representation, wherein the debris is further identified by subtracting the vegetation map from the foreground representation; and
- determining the debris information for the property based on the identified debris.

18. The method of claim 17, wherein the debris information comprises a debris score.

19. The method of claim 17, wherein the model is an automated valuation model.

* * * * *